US008919632B2

United States Patent
(12) United States Patent
Liu et al.

(10) Patent No.: US 8,919,632 B2
(45) Date of Patent: Dec. 30, 2014

(54) METHOD OF DETECTING WIRE BONDING FAILURES

(71) Applicant: ASM Technology Singapore PTE Ltd, Singapore (SG)

(72) Inventors: Wei Liu, Singapore (SG); Qian Zhang, Singapore (SG); Joon Ho Lee, Seoul (KR); Jung Min Kim, Seoul (KR)

(73) Assignee: ASM Technology Singapore Pte. Ltd., Singapore (SG)

(*) Notice: Subject to any disclaimer, the term of this patent is extended or adjusted under 35 U.S.C. 154(b) by 0 days.

(21) Appl. No.: 13/673,558

(22) Filed: Nov. 9, 2012

(65) Prior Publication Data

US 2014/0131425 A1 May 15, 2014

(51) Int. Cl.
*B23K 31/12* (2006.01)
*B23K 31/02* (2006.01)
*B23K 3/08* (2006.01)

(52) U.S. Cl.
CPC .......... *B23K 3/08* (2013.01)
USPC .......... 228/103; 228/180.5

(58) Field of Classification Search
CPC ...... H01L 24/78; H01L 24/85; B23K 20/007; B23K 20/005
USPC .......... 228/102–104, 180.5, 4.5, 904
See application file for complete search history.

(56) References Cited

U.S. PATENT DOCUMENTS

| | | | | |
|---|---|---|---|---|
| 4,422,568 | A * | 12/1983 | Elles et al. | 228/111 |
| 5,058,797 | A * | 10/1991 | Terakado et al. | 228/104 |
| 5,176,310 | A * | 1/1993 | Akiyama et al. | 228/180.5 |
| 5,326,015 | A * | 7/1994 | Weaver et al. | 228/102 |
| 5,342,807 | A * | 8/1994 | Kinsman et al. | 29/593 |
| 5,981,371 | A * | 11/1999 | Yamazaki et al. | 438/617 |
| 6,098,868 | A * | 8/2000 | Mae et al. | 228/102 |
| 6,102,275 | A * | 8/2000 | Hill et al. | 228/180.5 |
| 6,117,693 | A * | 9/2000 | Fogal et al. | 438/14 |
| 6,435,399 | B2 * | 8/2002 | Ikoma | 228/104 |
| 6,467,678 | B2 * | 10/2002 | Mochida et al. | 228/180.5 |
| 6,568,581 | B2 * | 5/2003 | Boller et al. | 228/103 |
| 6,681,352 | B1 * | 1/2004 | Fredrickson | 714/724 |
| 7,100,814 | B2 * | 9/2006 | Blood | 228/103 |
| 7,391,104 | B1 * | 6/2008 | Chang et al. | 257/678 |
| 7,658,314 | B2 * | 2/2010 | Tei et al. | 228/180.5 |
| 7,842,897 | B2 * | 11/2010 | Miyahara et al. | 219/56.21 |
| 7,857,190 | B2 * | 12/2010 | Takahashi et al. | 228/102 |

* cited by examiner

*Primary Examiner* — Devang R Patel
*Assistant Examiner* — Carlos Gamino
(74) *Attorney, Agent, or Firm* — Sughrue Mion, PLLC

(57) ABSTRACT

Disclosed is a method of detecting a bonding failure of a wire bonder, which comprises a bonding tool operative to form an electrical connection between a semiconductor die and a substrate using a bonding wire. The method comprises the steps of: forming a first wire bond on a first surface located on the semiconductor die using the bonding tool and the bonding wire; forming a second wire bond on a second surface located on the substrate using the bonding tool and the bonding wire such that a wire loop connects the first and second wire bonds, wherein the first surface is not electrically-conductive; moving the bonding tool in a direction away from the second wire bond to break the bonding wire from the second wire bond; detecting whether the second wire bond remains bonded to the substrate; and determining an occurrence of the bonding failure if the second wire bond is no longer bonded to the substrate.

7 Claims, 9 Drawing Sheets

METHOD OF DETECTING WIRE BONDING FAILURES

FIELD OF THIS INVENTION

This invention relates to a method of detecting wire bonding failures during semiconductor device fabrication.

BACKGROUND OF THE INVENTION

Semiconductor device fabrication involves many processes including wire bonding processes, in which electrical connections are formed between a semiconductor die (e.g. an integrated circuit die) and a substrate (e.g. a lead frame) to which the semiconductor die is bonded. In conventional wire bonding processes, a free air ball is first formed at one end of a wire before bonding the free air ball to the semiconductor die via ball bonding. Another wire bond (e.g. a wedge bond) is then formed between the wire and the substrate (e.g. a lead frame) to form an electrical connection between the semiconductor die and the substrate. Thereafter, the wire is clamped before being pulled in a direction away from substrate to detach the wire at the location of the wedge bond.

A non-stick-on-lead ('NSOL') bonding failure occurs if the wire is not properly bonded to the substrate via the wedge bond. In the case of conductive semiconductor dies, NSOL bonding failure can be detected via an electrical circuit as shown in FIG. 1. After a wire 100 from a wire spool (not shown) is detached from an electrical connection between a semiconductor die 106 and a substrate 104 at a location of a wedge bond 102, a tail wire 105 will be formed together with an open electrical circuit between the tail wire 105 and the substrate 104. As the tail wire 105 is at a higher relative electrical potential than the substrate 104 (which is grounded), detection of the higher electrical potential of the tail wire 105 relative to the conductive semiconductor die 106 means that the wire 100 has been successfully detached from the wedge bond 102, and accordingly, that NSOL bonding failure has not occurred. However, if the wire 100 is not successfully detached from the wedge bond 102 due to bonding failure of the wedge bond 102, the electrical potential of the wire 100 would be at an electrical potential that is comparable to the electrical ground potential of the substrate 104, because the semiconductor die 106 (to which the wire 100 is connected) is conductive. Therefore, detection of the lower electrical potential of the tail wire 105 relative to the conductive semiconductor die 106 means that NSOL bonding failure had occurred during wire bonding.

However, the aforesaid method of detecting NSOL bonding failure is applicable only to conductive semiconductor dies and not to non-conductive semiconductor dies. Therefore, it is an object of the present invention to seek to provide methods of detecting bonding failure that applies, particularly but not exclusively, to non-conductive semiconductor dies, and/or to provide the general public with a useful choice.

SUMMARY OF THE INVENTION

A first aspect of the invention is defined in claim 1.

A second aspect of the invention is defined in claim 16.

Some optional steps/features of the different aspects of the invention have been defined in the dependent claims.

BRIEF DESCRIPTION OF THE DRAWINGS

Preferred embodiments of the invention will now be described, by way of example only, with reference to the accompanying drawings, of which.

DETAILED DESCRIPTION OF THE PREFERRED EMBODIMENTS

Figure 1:
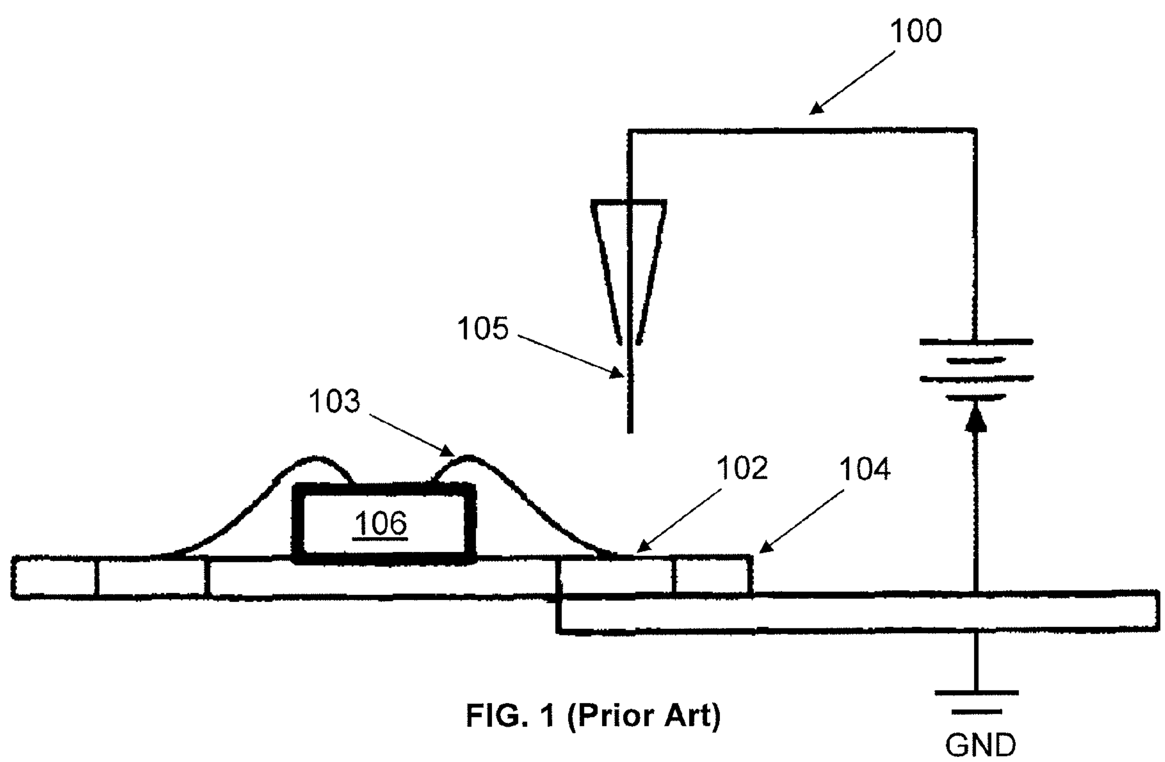
FIG. 1 shows a conventional method of detecting NSOL bonding failure.
Figure 2:
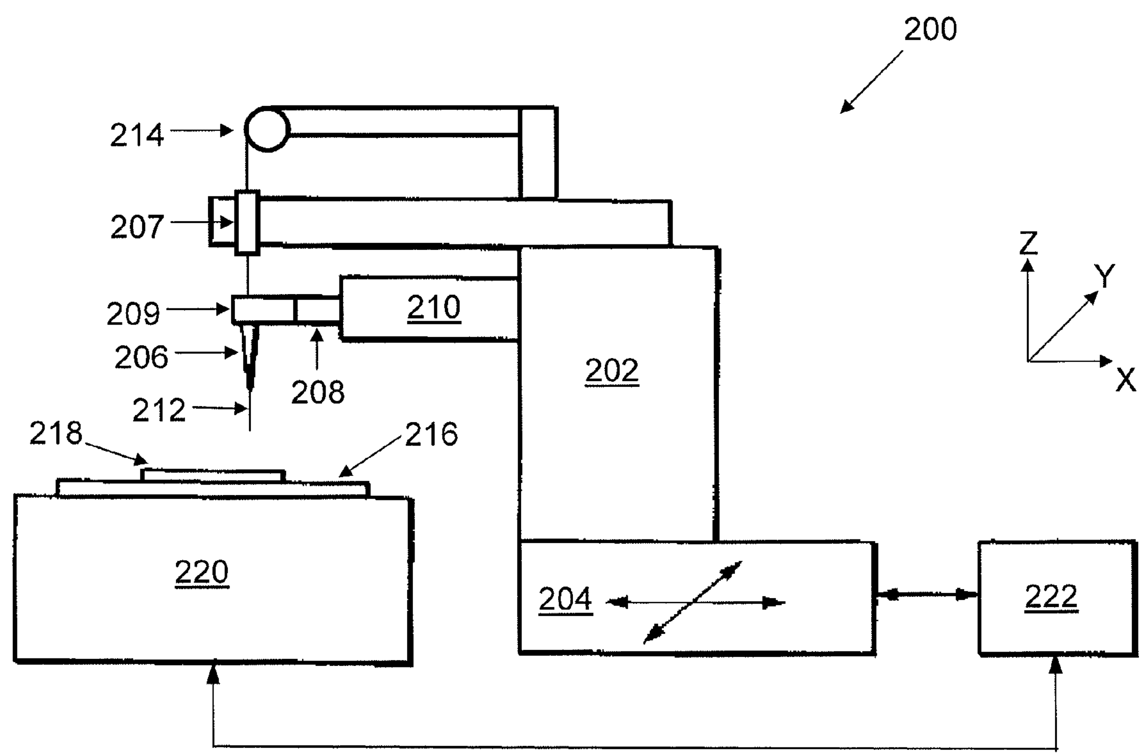
FIG. 2 shows a wire bonder that is capable of detecting NSOL bonding failure.

FIG. 2 shows a wire bonder 200 that is capable of detecting NSOL bonding failure according to a preferred embodiment of the invention. The wire bonder 200 comprises a bond head 202 connected to an XY table 204, which is in turn connected to a control device (shown as a personal computer 222) that controls the various parts of the wire bonder 200 during operation. A bonding tool (shown as a capillary 206), together with an ultrasonic transducer 208 and an ultrasonic horn 209, is connected to the bond head 202 via a bond arm 210 that extends from the bond head 202. A bonding wire 212 (e.g. Copper or Gold wire) from a wire spool 214 is introduced through a wire clamp 207 and the capillary 206. The wire bonder 200 also comprises a top plate 216 for supporting a substrate (shown as a lead frame 218) to which semiconductor dies (e.g. LED dies) are bonded. The top plate 216 is supported on a fixed table 220, which is also connected to the personal computer 222. During wire bonding, the ultrasonic transducer 208 transmits ultrasonic energy via the ultrasonic horn 209 to the capillary 206 when bonding the bonding wire 212 either to the semiconductor dies or to the lead frame 218 at a bottom tip 216*a* of the capillary 206. The motion of the capillary 206 on an XY-plane during wire bonding is controlled by the XY table 204. Although not shown in FIG. 2, it should be noted that the capillary 206 is further driven by an actuator along a vertical Z-axis.

Figure 3A:
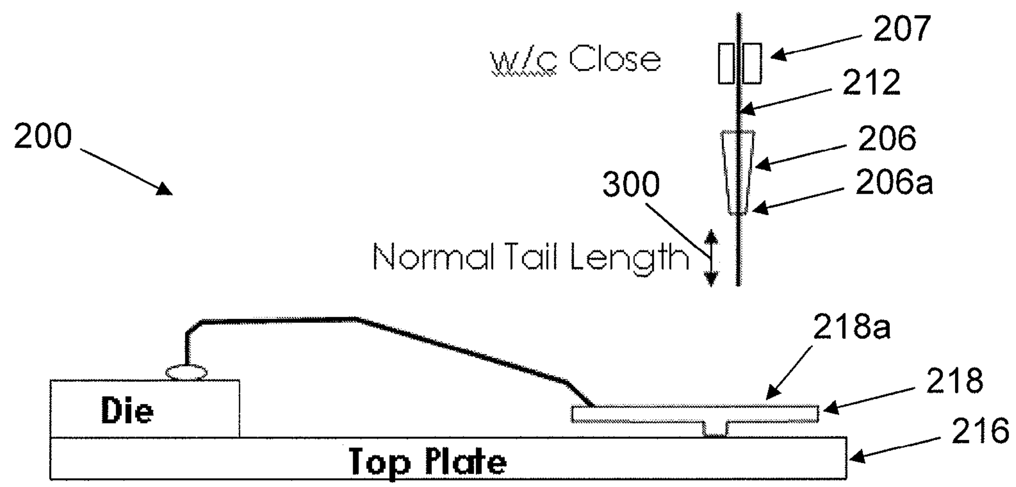
FIGS. 3*a* and 3*b* show an initialization process of the wire bonder of FIG. 2.
Figure 3B:
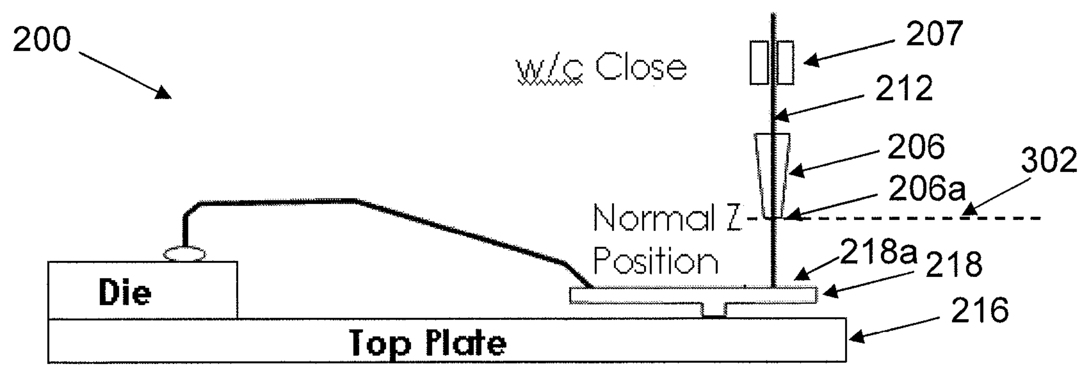

The wire bonder 200 is first initialised before it is ready to detect NSOL bonding failure. Initialisation of the wire bonder 200 includes determining a normal tail length 300 of the bonding wire 212—i.e. the length of the bonding wire 212 measured between a free end of its tail and the bottom tip 206*a* of the capillary 206, as shown in FIG. 3*a*. For instance, the normal tail length 300 of the bonding wire 212 may be determined to be 150 microns. Once the normal tail length 300 of the bonding wire 212 is determined, a normal position 302 of the bottom tip 206*a* of the capillary 206 can then be determined. Specifically, and as shown in FIG. 3*b*, the normal position 302 of the bottom tip 206*a* of the capillary 206 is its Z-position (or height) with respect to an upper surface 218*a* of the lead frame 218, in accordance with the normal tail length 300 of the bonding wire 212. This means that if the normal tail length 300 of the bonding wire 212 is 150 microns, the normal position 302 of the bottom capillary tip 206*a* would then be spaced at a distance of 150 microns from the upper surface 218*a* of the lead frame 218. Of course, it should be appreciated that the normal tail length 300 of the bonding wire 212 may be of other lengths besides 150 microns.

An operation of the wire bonder 200 that detects NSOL bonding failure according to a first preferred embodiment of the invention will now be described with reference to FIGS. 4*a* to 4*e*.

Figure 4A:
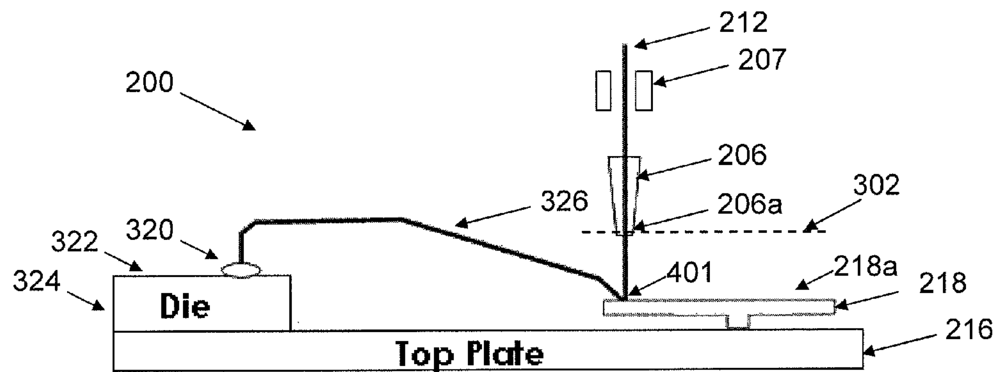
FIGS. 4*a* to 4*e* show an operation of the wire bonder of FIG. 2 according to a first preferred embodiment of the invention.

First, the wire bonder 200 forms a first wire bond (shown as a ball bond 320) on a first surface 322 located on a semiconductor die 324 using the capillary 206 and the bonding wire 212. Thereafter, the wire bonder 200 forms a second wire bond (shown as a wedge bond 401) on the upper surface 218*a* of the lead frame 218 using the capillary 206 and the bonding wire 212 such that a wire loop 326 connects the ball bond 320 and the wedge bond 401. It should be noted that the first surface 322 of the semiconductor die 324 is not electrically-conductive. After the wire bonder 200 has performed wire bonding (e.g. wedge bonding) of the bonding wire 212 onto the lead frame 218, the capillary 206 is moved in a direction away from the wedge bond 401 such that the bottom tip 206*a* of the capillary is positioned at the predetermined normal position 302, as shown in FIG. 4*a*. It should be noted that before the capillary 206 moves away from the wedge bond 401, the wire clamp 207 is opened to prevent any tension that might break the bonding wire 212 from the wedge bond 401 prematurely. Once the bottom tip 206*a* of the capillary 206 is positioned at its predetermined normal position 302 relative to the upper surface 218*a* of the lead frame 218, the wire clamp 207 is then closed to exert a gripping force on the bonding wire 212 in order to pull the bonding wire 212 away from the wedge bond 401.

Figure 4B:
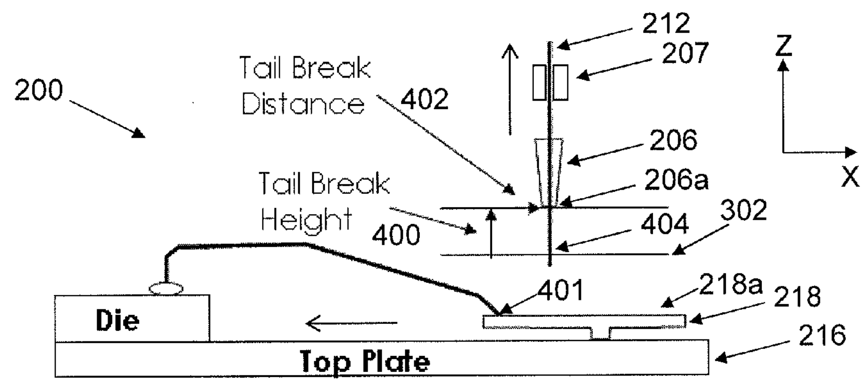

FIG. 4*b* shows the capillary 206 being moved further away from the wedge bond 401 by a tail break height 400 upwards along the Z-axis and also sideways along the X-axis together with the wire clamp 207 by a tail break distance 402 in order to pull the bonding wire 212 away from the wedge bond 401. This creates a tension that should break and separate the bonding wire 212 from the wedge bond 401 to form a tail wire 404 of a length substantially similar to the normal tail length 300. The wedge bond 401, however, would remain bonded to the lead frame 218. In particular, the sideways motion of the capillary 206 along the X-axis by the tail break distance 402 causes the tail wire 404 to bend (or incline) with respect to the Z-axis. By doing so, the variation in the angle of inclination of the different tail wires 404 relative to the Z-axis may advantageously be smaller than the case in which the bonding wire 212 breaks from the wedge bond 401 simply by moving the capillary 206 away from the lead frame 218 by the tail break height 400 upwards along the Z-axis. Nevertheless, it should be appreciated that the wire bonder 200 may be configured to move the capillary 206 away from the wedge bond 401 along the Z-axis by the tail break height 400, without additionally moving the capillary 206 sideward along the X-axis by the tail break distance 402.

Figure 4C:
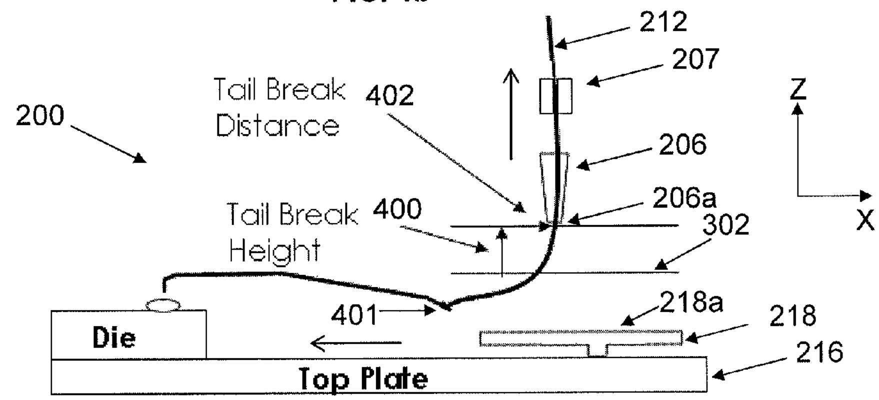

However, upon an occurrence of NSOL bonding failure, as shown in FIG. 4*c*, the bonding wire 212 does not break from the wedge bond 401, which instead detaches from the lead frame 218. Accordingly, no tail wire is formed. The formation of the tail wire 404 of a length corresponding to the normal tail length 300 in the absence of NSOL bonding failure, and the non-formation of the tail wire 404 in the presence of NSOL bonding failure, thus means that NSOL bonding failure can be detected by determining a position of the bottom tip 206*a* of the capillary 206 when the tip of the tail wire 404 (or the bonding wire 212) just contacts the upper surface 218*a* of the lead frame 218.

Figure 4D:
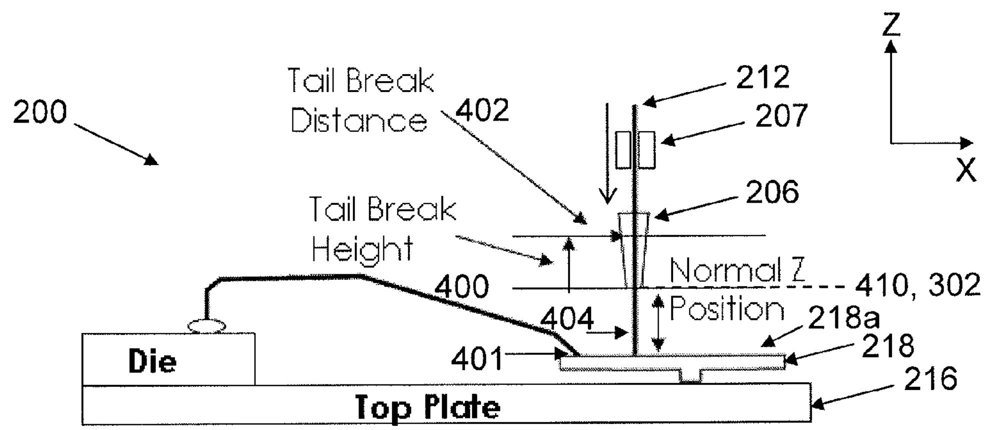
Figure 4E:
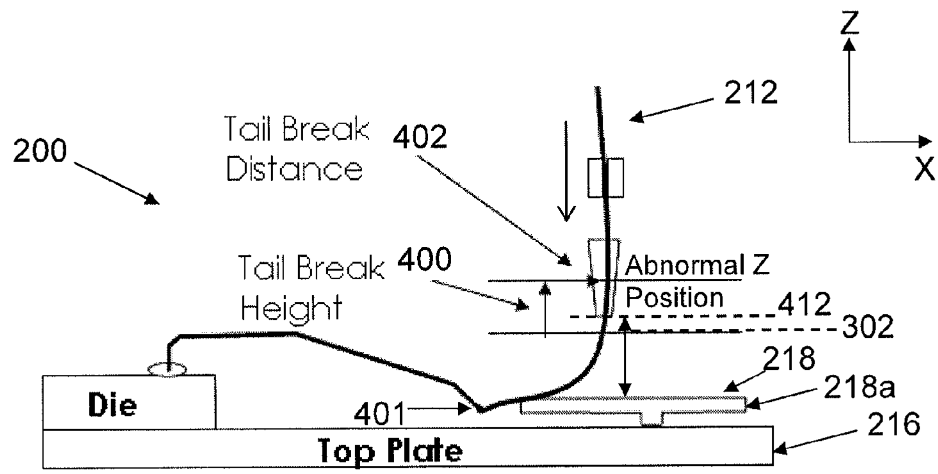

FIGS. 4*d* and 4*e* show that this is performed by moving the capillary 206 downwards along the Z-axis towards the lead frame 218, and detecting the position of the bottom capillary tip 206 when an electrical connection occurs between the tail wire 404 (or the bonding wire 212) and the upper surface 218*a* of the lead frame 218. Specifically, FIG. 4*d* shows the detected position 410 of the bottom tip 206*a* of the capillary 206 corresponding to its predetermined normal position 302, which indicates the absence of NSOL bonding failure. On the other hand, FIG. 4*e* shows the detected position 412 of the bottom tip 206*a* of the capillary 206 not corresponding to its predetermined normal position 302, which indicates the presence of NSOL bonding failure.

It should be appreciated that the position of the bottom tip 206*a* of the capillary 206, in cases whereby NSOL bonding failure is absent, may not necessarily correspond exactly to the predetermined normal position 302 of the bottom tip 206*a* of the capillary 206, but would be within a tolerance range of the same. For instance, the tolerance range may be within +/−20% of the predetermined Z-position (or height) of the bottom tip 206*a* of the capillary 206 relative to the upper surface 218*a* of the lead frame 218. Alternatively, the tolerance range may be within +/−10% or +/−5% of the predetermined normal position 302 of the bottom tip 206*a* of the capillary 206.

Figure 5:
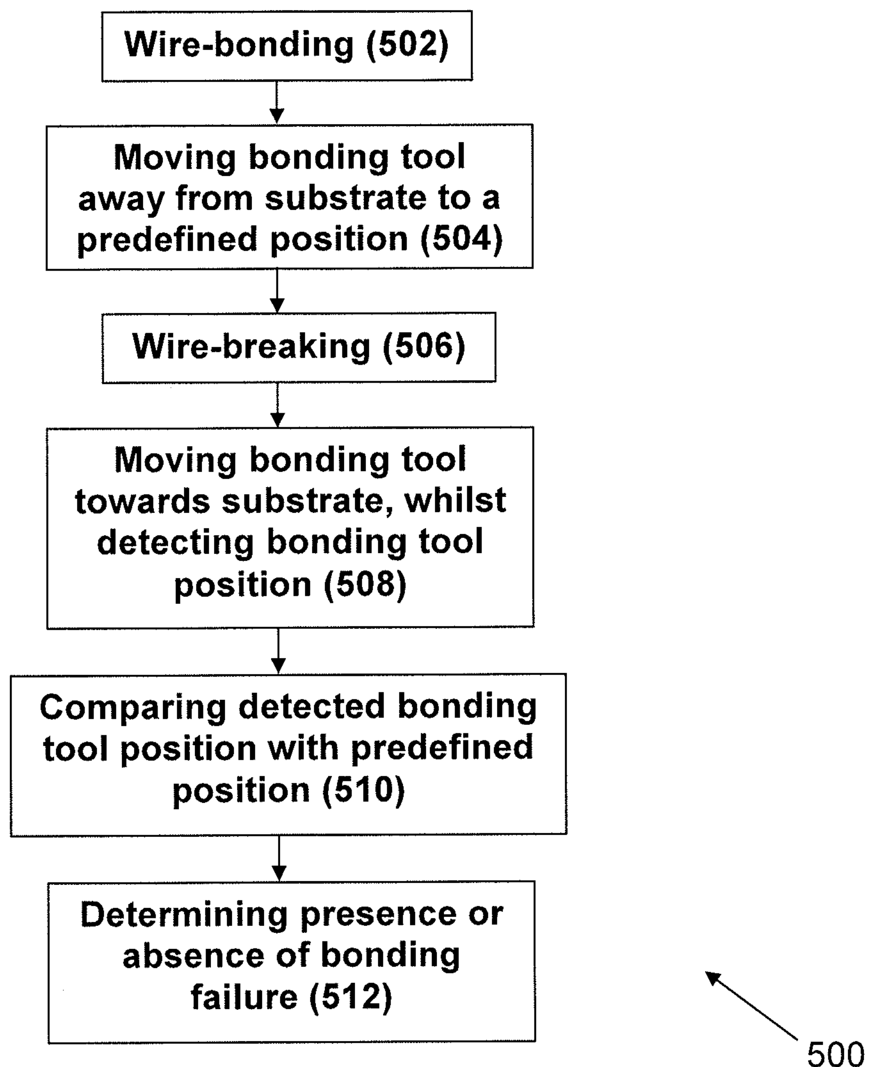
FIG. 5 is a flow chart setting out the operational steps of FIGS. 4*a* to 4*e;*

FIG. 5 is a flow chart 500 setting out the steps undertaken by the wire bonder 200 to detect NSOL bonding failure according to the first preferred embodiment of the invention.

First, the wire bonder 200 bonds the bonding wire 212 to the lead frame 218 via the bottom capillary tip 206*a* to form a wire bond (step 502). Next, the wire bonder 200 moves the bottom tip 206*a* of the capillary 206 in a direction away from the lead frame 218 to its predetermined normal position 302, to produce a length of bonding wire 212 between the wire bond and the bottom tip 206*a* of the capillary 206 (step 504). Thereafter, the wire bonder 200 clamps the bonding wire 212 using the wire clamp 207 and moves the capillary 206 further away from the lead frame 218 by the tail break height 400 and the tail break distance 402, so that the bonding wire 212 breaks from the wire bond where there is no NSOL bonding failure to form the tail wire 404 extending from the bottom tip 206*a* of the capillary 206 (step 506). Subsequently, the wire bonder 200 moves the bottom tip 206*a* of the capillary 206 towards the lead frame 218 whilst detecting a position of the bottom capillary tip 206*a* at which an electrical connection occurs between the wire and the lead frame 218 (step 508). The wire bonder 200 then compares the detected position of the bottom tip 206*a* of the capillary 206 against its predetermined normal position 302 (step 510). Based on the comparison, the wire bonder 200 finally determines whether there is NSOL bonding failure (step 512)—if there is no NSOL bonding failure, the detected position of the bottom capillary tip 206*a* corresponds to its predetermined normal position 302, and if there is NSOL bonding failure, the detected position of the bottom tip 206*a* of the capillary 206 does not correspond or is different from its predetermined normal position 302.

It should be appreciated that the wire bonder 200 is controlled by the personal computer 222 to perform the aforesaid steps as illustrated in the flow chart 600. Advantageously, the aforesaid method of detecting the NSOL bonding failure according to this embodiment of the invention is applicable to non-conductive semiconductor dies.

The method of detecting an NSOL bonding failure according to a second preferred embodiment of the invention will now be described with reference to the wire bonder 200, illustrated in FIG. 6*a*.

Figure 6A:
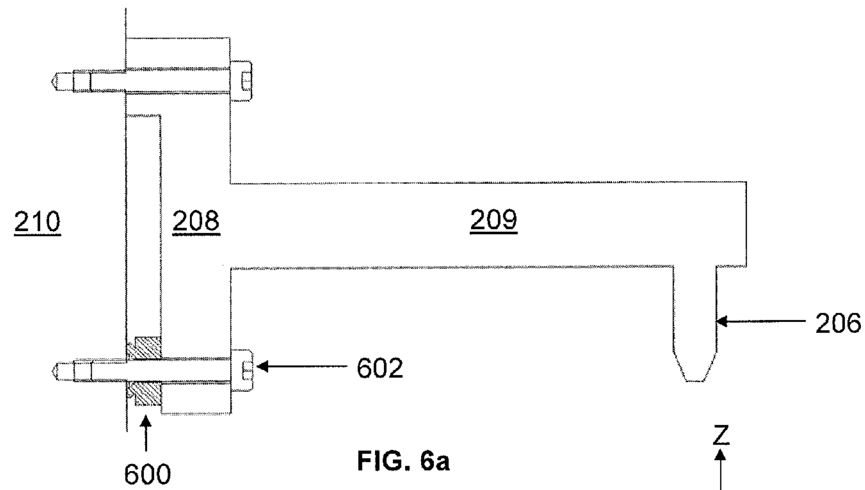
FIGS. 6*a* to 6*c* show the wire bonder of FIG. 2 comprising a piezoelectric sensor.

FIG. 6*a* shows the wire bonder 200 having a force sensor (shown as a piezoelectric sensor 600) arranged between the ultrasonic transducer 208 and the bond arm 210, and fixed in position by a screw 602. Specifically, the piezoelectric sensor 600 is operative to measure a force exerted by the ultrasonic transducer 208 along the X-axis on the piezoelectric sensor 600, based on the piezoelectric effect that converts the force to electrical current. In particular, the piezoelectric sensor 600 operates such that the amount of electrical current produced along an X-axis is proportional to the force applied along the X-axis.

Figure 6B:
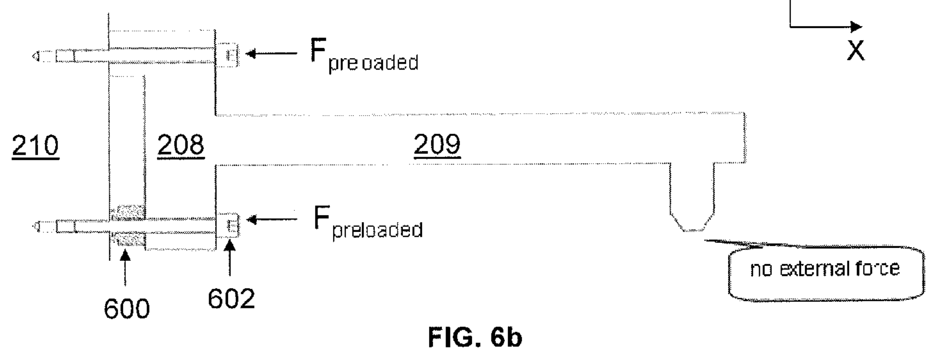

In order to calibrate the piezoelectric sensor 600, a preloaded force acting on the piezoelectric sensor 600 along the X-axis towards the bond arm 210 is first measured, as shown in FIG. 6*b*. This preloaded force is measured in the absence of external forces acting on the capillary 206, the ultrasonic transducer 208, and/or the ultrasonic horn 209 that will affect the force that acts on the piezoelectric sensor 600 along the X-axis towards the bond arm 210. The measured preloaded force is then stored in the wire bonder 200, for example by the personal computer 222.

Figure 6C:
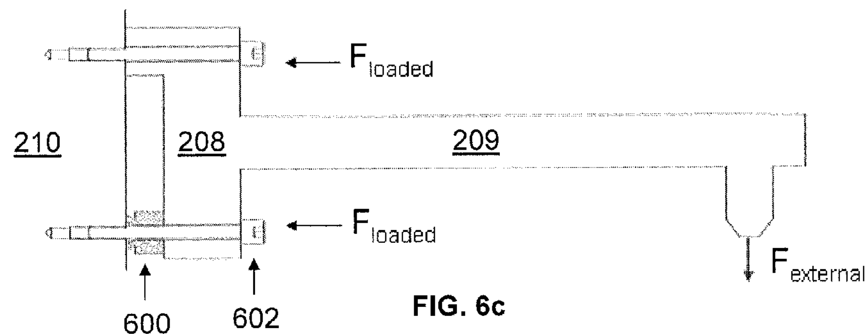

Next, a loading force acting on the piezoelectric sensor 600 along the same X-axis is then measured, as shown in FIG. 6*c*. This loading force is the force based on the external forces acting on the capillary 206, the ultrasonic transducer 208, and/or the ultrasonic horn 209 after the bonding wire 212 is successfully broken from the wedge bond 401 between the bonding wire 212 and the lead frame 218—which indicates an absence of NSOL bonding failure. The measured preloaded force is also stored in the wire bonder 200, for example by the personal computer 222. Alternatively, the difference in value between the preloaded and loading forces may be derived by the personal computer 222 and stored therein.

Figure 7A:
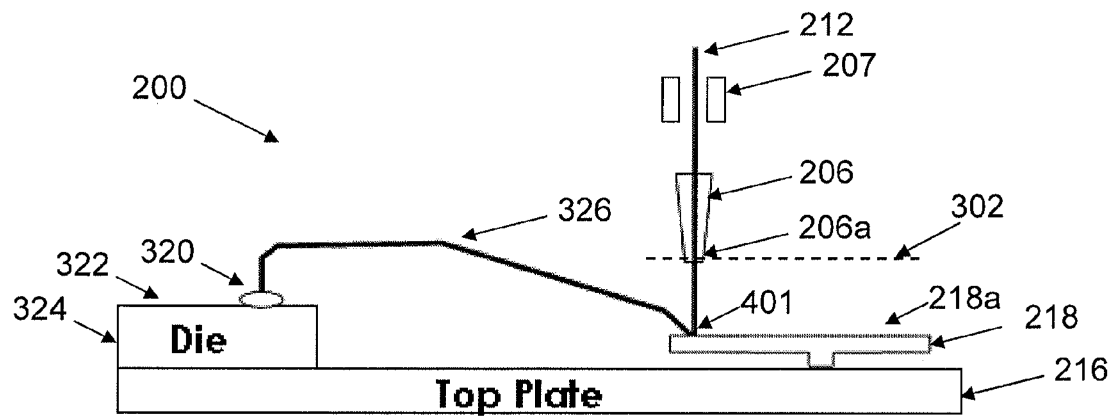
FIGS. 7*a* to 7*c* show an operation of the wire bonder of FIG. 2 according to a second preferred embodiment of the invention.

An operation of the wire bonder 200 that detects NSOL bonding failure according to this second preferred embodiment of the invention will now be described with reference to FIGS. 7*a* to 7*c*.

First, the wire bonder 200 forms a first wire bond (shown as a ball bond 320) on a first surface 322 located on a semiconductor die 324 using the capillary 206 and the bonding wire 212. Thereafter, the wire bonder 200 forms a second wire bond (shown as a wedge bond 401) on the upper surface 218*a* of the lead frame 218 using the capillary 206 and the bonding wire 212 such that a wire loop 326 connects the ball bond 320 and the wedge bond 401. It should be noted that it is not necessary in this case for the first surface 322 of the semiconductor die 324 to be electrically-conductive. After the wire bonder 200 has performed wire bonding (e.g. wedge bonding) between the bonding wire 212 and the lead frame 218, the capillary 206 is moved in a direction away from the wedge bond 401 such that the bottom tip 206*a* of the capillary 206 is positioned at the predetermined normal position 302, as shown in FIG. 7*a*. It should be noted that before the capillary 206 moves away from the wedge bond 401, the wire clamp 207 is opened to prevent any tension that might break the bonding wire 212 from the wedge bond 401. Once the bottom tip 206*a* of the capillary 206 is positioned at its predetermined normal position 302 that is relative to the upper surface 218*a* of the lead frame 218, the wire clamp 207 is then closed to exert a gripping force on the bonding wire 212 in order to pull the bonding wire 212 away from the wedge bond 401.

Figure 7B:
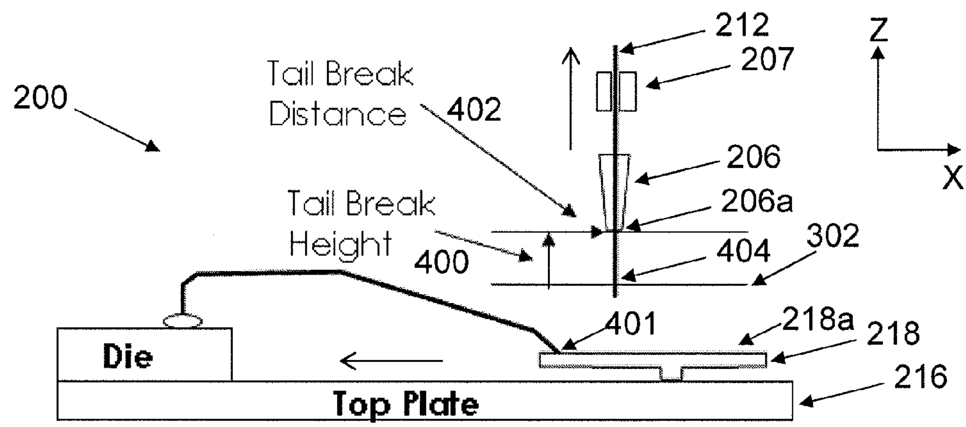

FIG. 7*b* shows the capillary 206 being moved further away from the wedge bond 401 by a tail break height 400 upwards along the Z-axis and also sideward along the X-axis together with the wire clamp 207 by a tail break distance 402 in order to pull the bonding wire 212 away from the wedge bond 401. This creates a tension that should break the bonding wire 212 from the wedge bond 401 to form a tail wire 404 of a length corresponding to the normal tail length 300. The wedge bond 401, however, would remain bonded to the lead frame 218. In particular, the motion of the capillary 206 along the X-axis by the tail break distance 402 causes the tail wire 404 to bend (or incline) with respect to the Z-axis. In the way, the variation in the angle of inclination of the different tail wires 404 relative to the Z-axis may advantageously be smaller than the case in which the bonding wire 212 breaks from the wedge bond 401 simply by moving the capillary 206 away from the lead frame 218 by the tail break height 400 upwards along the Z-axis. Nevertheless, it should be appreciated that the wire bonder 200 may be configured to move the capillary 206 away from the wedge bond 401 along the Z-axis by the tail break height 400, without additionally moving the capillary 206 sideward along the X-axis by the tail break distance 402.

As shown in FIG. 7*b*, the bonding wire 212 is successfully broken from the wedge bond 401. In this case, the force as measured by the piezoelectric sensor 600 based on the external forces acting on the capillary 206, the ultrasonic transducer 208, and/or the ultrasonic horn 209 along the X-axis would correspond to the loaded force that was previously derived. Alternatively, the difference between the values of the measured and preloaded forces would correspond to the difference between the values of the previously-derived loaded and preloaded forces.

Figure 7C:
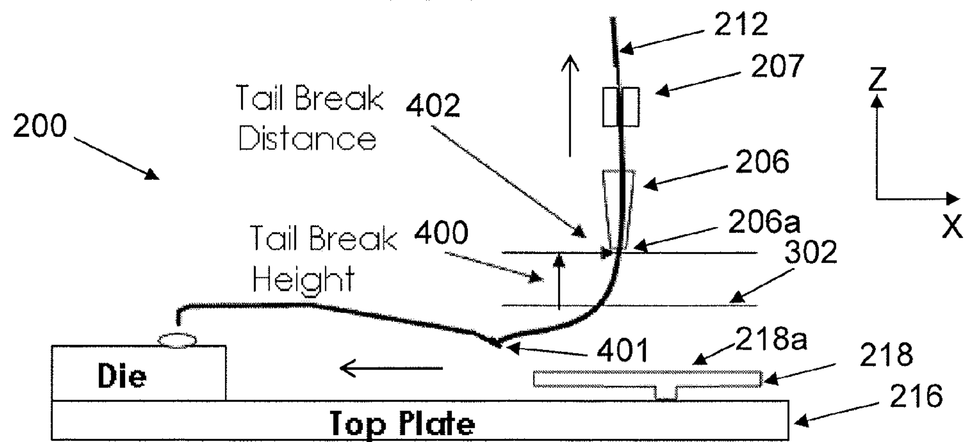

However, in a presence of NSOL bonding failure, the bonding wire 212 does not break from the wedge bond 401 which instead detaches from the lead frame 218, as shown in FIG. 7*c*. Accordingly, no tail wire is formed. This means that the force as measured by the piezoelectric sensor 600 along the X-axis based on the external forces acting on the capillary 206, the ultrasonic transducer 208, and/or the ultrasonic horn 209 would not correspond to the loading force that was previously derived. In this case, the force as measured by the piezoelectric sensor 600 would be larger than the predetermined loaded force. Alternatively, the difference between the values of the measured force and the preloaded force would not correspond to the difference between the values of the previously-derived loading and preloaded forces.

Again, it should be appreciated that the force as measured by the piezoelectric sensor 600, in cases whereby the NSOL bonding failure is absent, may not necessarily correspond exactly to the previously-derived loading force, but would be within a tolerance range of the same. For instance, the tolerance range may be within +/−20% of the loading force that was previously derived. Alternatively, the tolerance range may be within +/−10% or +/−5% of the loading force.

Yet alternatively, in the absence of NSOL bonding failure, the force as measured by the piezoelectric sensor 600 after the capillary 206 has moved by the tail break height may be less than a predetermined reference force, whereas in the presence of NSOL bonding failure, the force as measured by the piezoelectric sensor 600 would be greater than the predetermined reference force. Such a predetermined reference force may be an average of a typical force as measured by the piezoelectric sensor 600 when the bonding wire 212 is being tensioned to break away from the wedge bond 401 and a typical force as measured by the same when the capillary 206 has been moved by the tail break height 400 and the bonding wire 212 has successfully broken from the wedge bond 401 to form the tail wire 404. Again, such a predetermined reference force may be stored in the personal computer 222 of the wire bonder 200.

Figure 8:
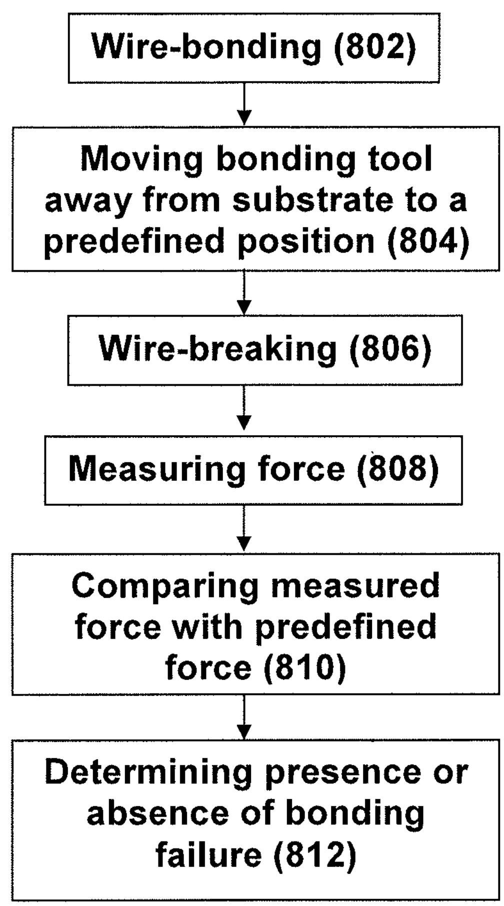
FIG. 8 is a flow chart setting out the operational steps of FIGS. 7*a* to 7*c*.

FIG. 8 is a flow chart 800 setting out the steps undertaken by the wire bonder 200 to detect the NSOL bonding failure according to the second preferred embodiment of the invention.

First, the wire bonder 200 bonds the bonding wire 212 to the lead frame 218 via the bottom tip 206*a* of the capillary 206 to form a wire bond (step 802). Next, the wire bonder 200 moves the bottom tip 206*a* of the capillary 206 in a direction away from the lead frame 218 to its predetermined normal position 302, to produce a length of the bonding wire 212 between the wire bond and the bottom tip 206*a* of the capillary 206 (step 804). Thereafter, the wire bonder 200 clamps the bonding wire 212 using the wire clamp 207 and moves the capillary 206 further away from the lead frame 218, so that the bonding wire 212 breaks from the wire bond if there is no NSOL bonding failure to form the tail wire 404 extending from the bottom tip 206*a* of the capillary 206 (step 806). After the bottom tip 206*a* of the capillary 206 has been moved through the tail break height 400 and the tail break distance 402, the piezoelectric sensor 600 measures the force acting on the piezoelectric sensor 600 along the X-axis based on the external forces acting on the capillary 206, the ultrasonic transducer 208, and/or the ultrasonic horn 209 (step 808), before comparing the force against the loaded force (or the reference force) that was previously derived or predetermined (step 810). Based on the comparison, the wire bonder 200 finally determines an absence or presence of any NSOL bonding failure (step 812).

It should be appreciated that the wire bonder 200 is controlled by the personal computer 222 to perform the aforesaid steps as set out in the flow chart 800.

Advantageously, the aforesaid method of detecting the NSOL bonding failure according to the second preferred embodiment of the invention applies to non-conductive semiconductor dies. It should also be noted that this particular method of detecting NSOL bonding failure may also apply to conductive semiconductor dies as well.

It should also be appreciated that various embodiments of the invention are also possible without departing from the scope of the present invention. For instance, the wire bonder 200 may incorporate both the aforesaid methods of detecting NSOL bonding failure based on the position of the bottom tip 206*a* of the capillary 206, as well as the measured force of the piezoelectric sensor 600 to enhance the robustness in NSOL bonding failure detection.

The invention claimed is:

1. A method of detecting a bonding failure of a wire bonder, the wire bonder comprising a bonding tool operative to form an electrical connection between a semiconductor die and a substrate using a bonding wire, the method comprising the steps of:

forming a first wire bond on a first surface located on the semiconductor die using the bonding tool and the bonding wire;

forming a second wire bond on a second surface located on the substrate using the bonding tool and the bonding wire such that a wire loop connects the first and second wire bonds;

moving the bonding tool in a direction away from the second wire bond to break the bonding wire from the second wire bond;

detecting that the second wire bond does not remain bonded to the substrate; and determining an occurrence of the bonding failure, wherein the step of detecting that the second wire bond does not remain bonded to the substrate comprises the steps of:

moving the bonding tool in a direction towards the substrate while detecting a position of the bonding tool at which an electrical connection occurs between the bonding wire and the substrate;

comparing the detected position of the bonding tool with a predetermined position of the bonding tool, the predetermined position of the bonding tool indicating an absence of a bonding failure;

detecting that the detected position of the tip of the bonding tool does not substantially correspond to the predetermined position of the bonding tool; and determining that the second wire bond is no longer bonded to the substrate.

2. The method of claim 1, wherein the step of moving the bonding tool in the direction away from the second wire bond comprises the step of moving the bonding tool in upward and sideways directions.

3. The method of claim 1, wherein the step of moving the bonding tool in the direction away from the second wire bond to break the bonding wire from the second wire bond comprises the step of positioning the bonding tool at a predetermined position before the bonding wire is clamped to pull the bonding wire from the second wire bond.

4. The method of claim 3, wherein the predetermined position of the bonding tool is spaced from the second wire bond.

5. The method of claim 1, wherein the detected position of the bonding tool does not substantially correspond to the predetermined position of the bonding tool if it is outside a tolerance range of 20% from the predetermined position.

6. The method of claim 1, wherein the detected position of the bonding tool does not substantially correspond to the predetermined position of the bonding tool if it is outside a tolerance range of 10% from the predetermined position.

7. The method of claim 1, wherein the detected position of the bonding tool does not substantially correspond to the predetermined position of the bonding tool if it is outside a tolerance range of 5% from the predetermined position.

* * * * *